United States Patent
Ni et al.

(10) Patent No.: US 11,025,246 B2
(45) Date of Patent: Jun. 1, 2021

(54) SWITCH CONTROL CIRCUIT AND SWITCH CONTROL SYSTEM

(71) Applicant: Wenzhou MTLC Electric Appliances Co.,Ltd, Zhejiang (CN)

(72) Inventors: Lidong Ni, Zhejiang (CN); Wei Gao, Zhejiang (CN)

(73) Assignee: Wenzhou MTLC Electric Appliances Co., Ltd., Zhejiang (CN)

( * ) Notice: Subject to any disclaimer, the term of this patent is extended or adjusted under 35 U.S.C. 154(b) by 0 days.

(21) Appl. No.: 16/592,397

(22) Filed: Oct. 3, 2019

(65) Prior Publication Data

US 2020/0136605 A1   Apr. 30, 2020

(30) Foreign Application Priority Data

Oct. 30, 2018   (CN) .......................... 2018 1 1282143

(51) Int. Cl.
| | |
|---|---|
| *H03K 17/00* | (2006.01) |
| *H03K 17/693* | (2006.01) |
| *H03K 19/02* | (2006.01) |
| *H03K 17/13* | (2006.01) |
| *H01H 47/00* | (2006.01) |

(52) U.S. Cl.
CPC ......... *H03K 17/133* (2013.01); *H01H 47/005* (2013.01)

(58) Field of Classification Search
CPC .......................... H03K 17/133; H01H 47/005
See application file for complete search history.

(56) References Cited

U.S. PATENT DOCUMENTS

| | | | | |
|---|---|---|---|---|
| 5,715,256 | A * | 2/1998 | Mohd | G01R 31/318541 714/726 |
| 7,397,283 | B2 * | 7/2008 | Chiu | H04N 5/4403 326/115 |
| 9,525,408 | B2 * | 12/2016 | He | H03K 17/005 |
| 10,044,343 | B2 * | 8/2018 | Abe | B41J 2/04593 |

\* cited by examiner

*Primary Examiner* — Kenneth B Wells
(74) *Attorney, Agent, or Firm* — Ziegler IP Law Group, LLC

(57) ABSTRACT

A switch control circuit and a switch control system includes a plurality of parallel-connected signal processing units. A first voltage signal and second voltage signal control turning-on and turning-off of the first controllable switch, and converting the first voltage signal into a third voltage signal; and the third voltage signal being connected with the first port of the controller; and the controller, configured to send a switch control instruction to a to-be-controlled terminal based on the third voltage signal. This circuit converts a electrical signal of a high voltage in strong electricity into a stable electrical signal of a low voltage in weak electricity, implements multiplex switch control in conjunction with the controller, and only processes voltage signals in the whole circuit, thereby avoiding processing signals of a plurality of types, and guaranteeing the reliability of the multiplex switch control.

7 Claims, 7 Drawing Sheets

SWITCH CONTROL CIRCUIT AND SWITCH CONTROL SYSTEM

TECHNICAL FIELD

The aspects of the disclosed embodiments relate to the field of electronic circuit technology and in particular to, a switch control circuit and a switch control system.

BACKGROUND

Generally, operations of a power switch of an electrical device are controlled locally by a user. The power switch of the electrical device can be operated only at a fixed position only when the user approaches the electrical device.

With the improvement of people's living standards and quality, there are increasingly more types of electrical devices on the market, people have more and more demands for intelligentization of the electrical devices, and intelligentization of power switch control of the electrical devices appears to be particularly important. In some scenarios where there are various types of and a large number of electrical devices with the above control approach of the electrical devices, the user needs to approach a plurality of electrical devices one by one to manually control power switches of the electrical devices. The operations are very inconvenient.

Thus, in order to solve the above technological problems, the existing technologies generally implement switch control of the electric devices using an optocoupler, or a communication-based chip (e.g., zigbee). However, the switch control circuit in the existing technologies needs to process signals of a plurality of types (e.g., an optical signal, an electrical signal, or a communication signal), and some errors exist in the conversion between signals of different types, which will result in low reliability of the switch control circuit.

SUMMARY

In view of this, embodiments of the present disclosure provide a switch control circuit and a switch control system, to solve the problem of low reliability of the existing switch control circuit.

According to a first aspect, an embodiment of the present disclosure provides a switch control circuit, including:

a plurality of parallel-connected signal processing units, the signal processing unit having a first controllable switch; the first controllable switch having a first terminal connected to a first voltage signal, a second terminal connected to a first port of a controller, and a third terminal connected to a second voltage signal; the first voltage signal and the second voltage signal controlling turning-on and turning-off of the first controllable switch, and converting the first voltage signal into a third voltage signal; and the third voltage signal being connected with the first port of the controller; and the controller, configured to send a switch control instruction to a to-be-controlled terminal based on the third voltage signal.

The switch control circuit provided in the embodiment of the present disclosure converts the first voltage signal with the signal processing unit into the third voltage signal suitable for the controller to work, and then implements multiplex switch control on the to-be-controlled terminal with the controller. The circuit converts an electrical signal of a high voltage in strong electricity into a stable electrical signal of a low voltage in weak electricity, implements multiplex switch control in conjunction with the controller, and only processes voltage signals in the whole circuit, thereby avoiding processing signals of a plurality of types, and guaranteeing the reliability of the multiplex switch control.

In combination with the first aspect, in the first embodiment of the first aspect, the signal processing unit includes:

a preprocessing circuit, connected to the first terminal of the first controllable switch; where an input terminal of the preprocessing circuit is connected to the first voltage signal, and is configured to perform at least one of rectifying, voltage dividing, or current limiting on the first voltage signal; and where the second terminal of the first controllable switch is connected to a first direct current power source, and the second voltage signal is zero.

Prior to converting the first voltage signal, the switch control circuit provided in the embodiment the present disclosure can guarantee the stability of electrical signals inputted into the first controllable switch by preprocessing the first voltage signal, providing conditions for subsequent conversion. In addition, the first controllable switch converts the first voltage signal into the third voltage signal, so that the switch circuit configuration is simple, and is easy for implementation.

In combination with the first embodiment of the first aspect, in a second embodiment of the first aspect, the preprocessing unit includes:

a first diode, configured to rectify the first voltage signal;

a first resistor, connected to the first diode in series, and configured to perform current limiting on the first voltage signal; and a voltage dividing branch circuit, having a second resistor and a third resistor, where the second resistor is connected in series between the first diode and the first resistor, and one terminal of the third resistor is connected between the first resistor and the second resistor.

In combination with the second embodiment of the first aspect, in a third embodiment of the first aspect, the preprocessing unit further includes:

a second diode, connected in parallel to the third resistor, and configured to perform voltage regulation on the first voltage signal; and a first capacitor, connected in parallel to the third resistor, and configured to perform filtering on the first voltage signal.

In combination with the first embodiment of the first aspect, in a fourth embodiment of the first aspect, the first controllable switch is a first triode, the first terminal is a base electrode of the first triode, the second terminal is a collecting electrode of the first triode, and the third terminal is an emitting electrode of the first triode.

According to a second aspect, an embodiment of the present disclosure further provides a switch control system, including:

the switch control circuit according to the first aspect or any one embodiment of the first aspect of the present disclosure; and a load, connected to an output terminal of the controller; the switch control circuit being configured for multiplex switch control of the load.

The switch control system provided in the embodiment of the present disclosure converts the first voltage signal with the signal processing unit into the third voltage signal suitable for the controller to work, and then implements multiplex switch control on the to-becontrolled terminal with the controller. That is, the circuit converts an electrical signal of a high voltage in strong electricity into a stable electrical signal of a low voltage in weak electricity, implements multiplex switch control in conjunction with the controller, and only processes voltage signals in the whole circuit, thereby avoiding processing signals of a plurality of types, and guaranteeing the reliability of the multiplex switch control.

In combination with the second aspect, in a first embodiment of the second aspect, the load is a relay load circuit; where the system includes:

two parallel-connected signal processing units, where an input terminal of each of the signal processing units is connected to a corresponding switch, respectively;

a zero crossing sampling circuit, having a second controllable switch; the zero crossing sampling circuit having an input terminal connected to a power source of the load, and an output terminal connected to a second port of the controller; where the zero crossing sampling circuit converts the power source of the load into a direct current signal through turning-on and turning-off of the second controllable switch; and the controller extracting a zero voltage point of the power source of the load through the direct current signal, and sending a switch control instruction to the relay load circuit based on the third voltage signal and the zero voltage point.

The switch control system provided in the embodiment of the present disclosure causes the controller through the zero crossing sampling circuit to extract a zero voltage point of the power source of the load. When sending a switch control instruction to the relay load circuit, the controller can guarantee relay pick-up at the zero voltage point in combination with the zero voltage point, thereby improving the service life of the relay pick-up point.

In combination with the first embodiment of the second aspect, in a second embodiment of the second aspect, the zero crossing sampling circuit includes:

the second controllable switch, having a fourth terminal, a fifth terminal, and a sixth terminal; where the fourth terminal is connected to the power source of the load; the fifth terminal is connected to a second direct current power source, and is connected to the second port of the controller; and the sixth terminal is grounded; and a fourth resistor, the power source of the load connected to the fourth terminal through the fourth resistor; where the fourth resistor is configured to perform current limiting on the power source of the load.

The switch control system provided in the embodiment of the present disclosure converts the power source of the load through the second controllable switch into a direct current signal. The circuit configuration is simple, and is easy for implementation.

In combination with the second embodiment of the second aspect, in a third embodiment of the second aspect, the second controllable switch is a second triode, the fourth terminal is a base electrode of the second triode, the fifth terminal is a collecting electrode of the second triode, and the sixth terminal is an emitting electrode of the second triode.

In combination with the first embodiment of the second aspect, in a fourth embodiment of the second aspect, the sending a switch control instruction to the relay load circuit based on the third voltage signal and the zero voltage point includes:

acquiring relay pick-up time in the relay load circuit and a zero crossing point period of the power source of the load;

calculating a difference value between the zero crossing point period and the pick-up time; and delaying for the difference value at the zero voltage point based on the third voltage signal, and sending the switch control instruction.

The switch control system provided in the embodiment of the present disclosure controls a relay to execute a relay action after delaying certain time after the zero crossing point, to cause the relay to be closed accurately at the zero crossing point, thereby effectively protecting relay contacts.

BRIEF DESCRIPTION OF THE DRAWINGS

To more clearly describe the technical solutions of the specific embodiments of the present disclosure or the existing technologies, the accompany drawings to be used in the description of the specific embodiments or the existing technologies will be briefly introduced as follows. Apparently, the accompanying drawings described below are some embodiments of the present disclosure. For those skilled in the art, other drawings may also be obtained according to these drawings without making inventive efforts.

DETAILED DESCRIPTION

To make the objectives, the technical solutions and the advantages of the embodiments of the present disclosure clearer, the technical solutions of the embodiments of the present disclosure will be clearly and completely described below with reference to the accompanying drawings in the embodiments of the present disclosure. Apparently, the embodiments described below are a part, instead of all, of the embodiments of the present disclosure. Based on the embodiments of the present disclosure, all other embodiments obtained by those skilled in the art without making inventive efforts shall fall within the scope of protection of the present disclosure.

In the description of the present disclosure, it should be noted that the terms "first," "second," and "third" are used for illustrative purposes only, and should not be understood to indicate or imply relative importance.

In addition, the technical features involved in different embodiments of the present disclosure described below may be combined with each other without conflict.

Figure 1:
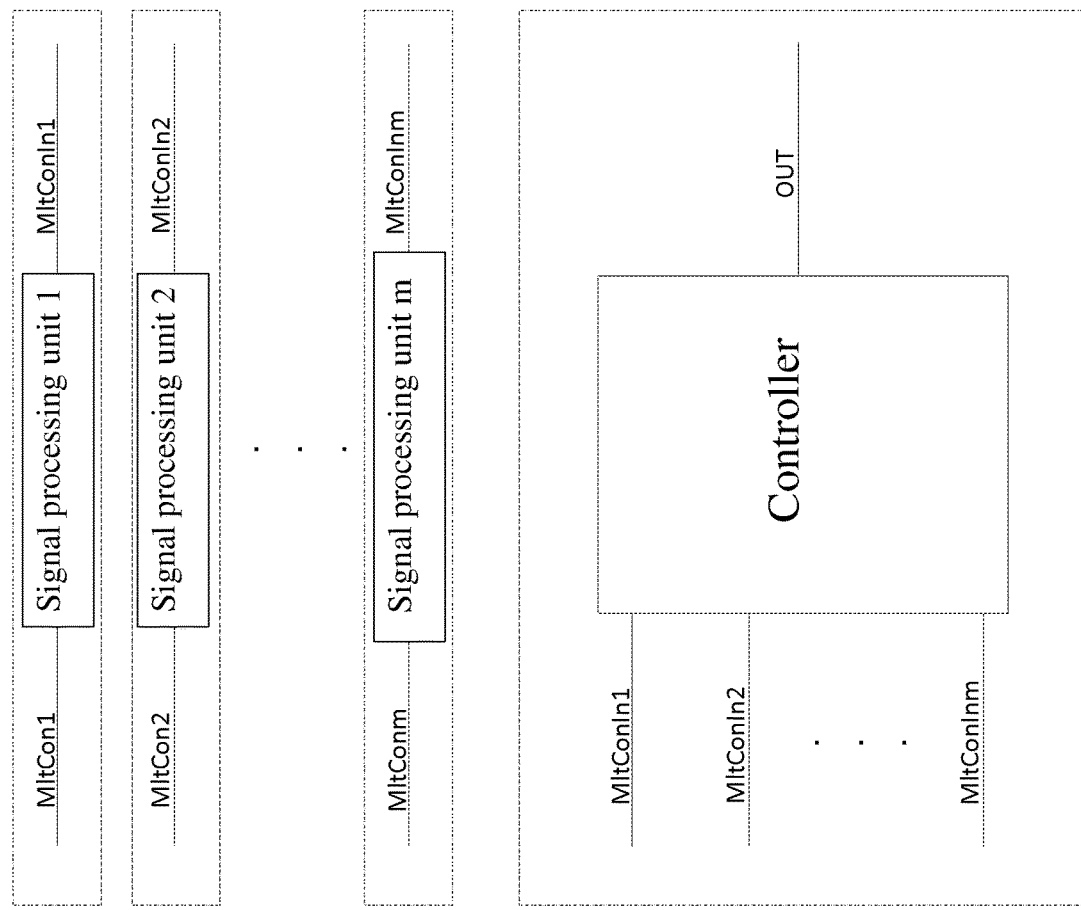
FIG. 1 is a structural schematic diagram of a switch control circuit according to an embodiment of the present disclosure.

An embodiment of the present disclosure provides a switch control circuit, as shown in FIG. 1. The circuit includes: a plurality of parallel-connected signal processing units, and a controller. Input terminals of the signal processing units are connected to first voltage signals, respectively MltCon1, MltCon2, . . . , and MltConm, and correspondingly output third voltage signals, respectively MltConIn1, MltConIn2, . . . , and MltConInm In addition, an output terminal of each of the signal processing units is connected to a pin of the controller, and an output signal OUT of the controller is used for controlling on/off of a to-be-controlled terminal.

Specifically, the signal processing unit has a first controllable switch. The first controllable switch has a first terminal connected to a first voltage signal, a second terminal connected to a first port of the controller, and a third terminal connected to a second voltage signal. The first voltage signal and the second voltage signal control turning-on and turning-off of the first controllable switch, and convert the first voltage signal into a third voltage signal.

Further, for the first controllable switch, when a voltage of the first voltage signal is greater than a voltage of the second voltage signal, the first controllable switch is turned on, and outputs a first voltage (i.e., the voltage of the second voltage signal); while when the voltage of the first voltage signal is less than the voltage of the second voltage signal, the first controllable switch is turned off, and outputs a second voltage. Thus, when the first voltage signal is changed, the third voltage signal (i.e., output of the first controllable switch) is also changed.

In addition, the controller sends a switch control instruction to the to-be-controlled terminal based on the third voltage signal. The signal converting circuit converts the first voltage signal into the third voltage signal suitable for the controller to work, and when the first voltage signal is changed, the third voltage signal is also changed accordingly. Therefore, the controller can determine whether the first voltage signal at a corresponding position is changed based on whether the third voltage signals corresponding to the pins of the first port are changed, so as to send a switch control instruction to the to-be-controlled terminal based on the determining result, and implement multiplex switch control of the to-be-controlled terminal.

The switch control circuit provided in the embodiment of the present disclosure converts the first voltage signal with the signal processing unit into the third voltage signal suitable for the controller to work, and then implements multiplex switch control on the to-be-controlled terminal with the controller. That is, the circuit converts a electrical signal of a high voltage in strong electricity into a stable electrical signal of a low voltage in weak electricity, implements multiplex switch control in conjunction with the controller, and only processes voltage signals in the whole circuit, thereby avoiding processing signals of a plurality of types, and guaranteeing the reliability of the multiplex switch control.

Alternatively, the first controllable switch may be a triode, or a transistor of other voltage control type, as long as the first controllable switch is capable of converting the first voltage signal into the third voltage signal suitable for the controller to work.

Further alternatively, a signal converting unit can further include other signal processing units, to achieve processing of the first voltage signal.

As an alternative implementation of the present embodiment, the signal converting unit can further include a preprocessing circuit, configured to preprocess the first voltage signal. The first voltage signal connected with the signal converting unit is processed by the preprocessing circuit, and then connected to the first terminal of the first controllable switch. The first controllable switch is turned on or turned off based on relationship between the first voltage signal and the second voltage signal connected with the third terminal, thereby outputting different third voltage signals at the second terminal.

Figure 2:
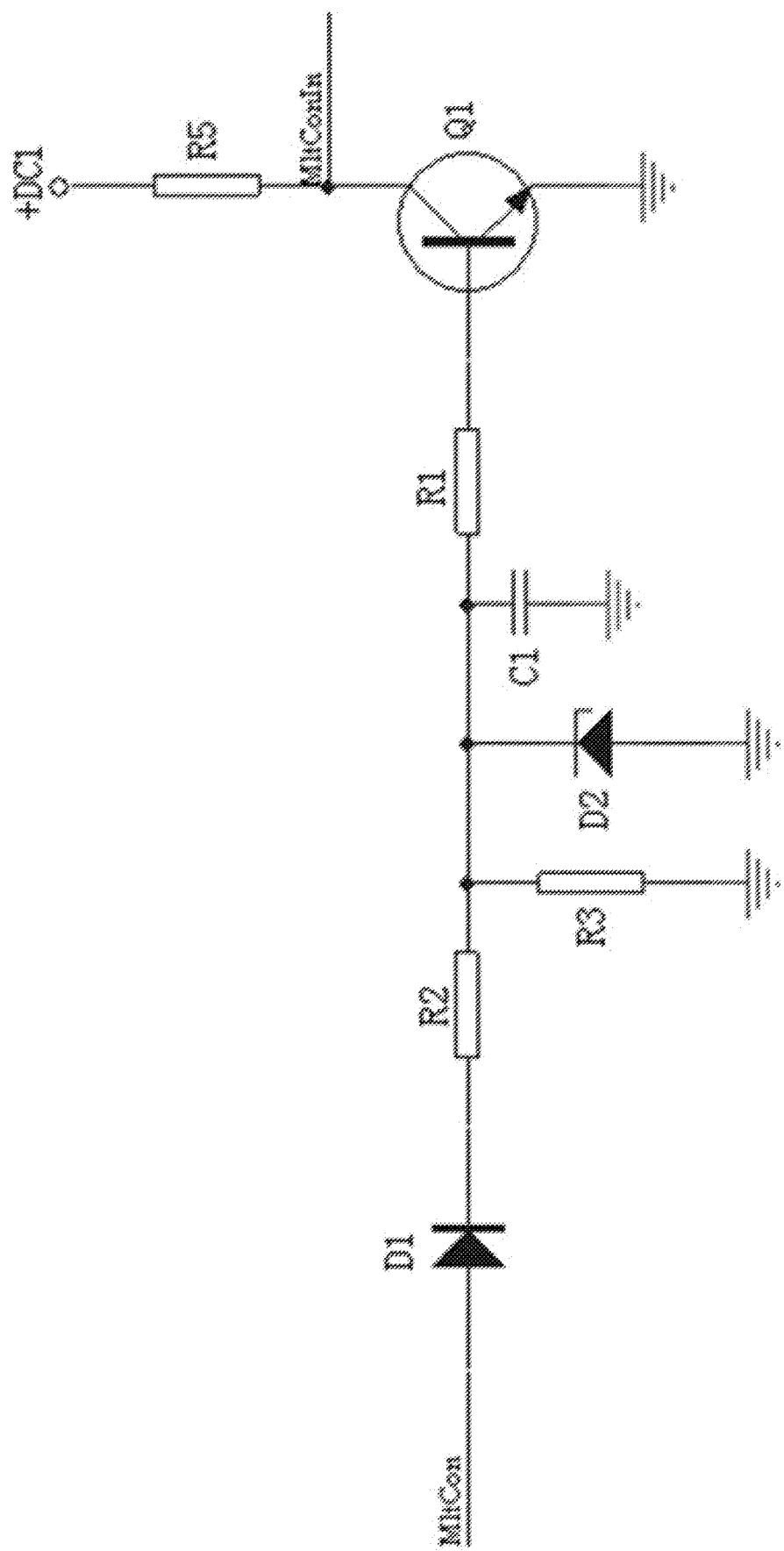
FIG. 2 is a structural schematic diagram of a signal processing unit according to an embodiment of the present disclosure.

Specifically, FIG. 2 shows a structural schematic diagram of the signal converting unit. As shown in FIG. 2, MltCon is a signal connected with an input terminal of the signal converting unit, i.e., the first voltage signal; and MltConIn is a signal of an output terminal of the signal converting unit, i.e., the third voltage signal inputted into the first port of the controller.

Further, the preprocessing circuit is a circuit between an access point of the MltCon and the first terminal of the first controllable switch. The first voltage signal (MltCon) of the input terminal of the preprocessing circuit is connected with the first terminal of a first controllable switch Q1, and is used for performing at least one of rectifying, voltage dividing, or current limiting on the first voltage signal. The functions and number of components and parts in the preprocessing circuit can be specifically set according to the actual situation, and are not defined here. Alternatively, as shown in FIG. 2, the preprocessing circuit includes a first diode D1, a first resistor R1, and a voltage dividing branch circuit. The first diode D1 has an anode connected to the first voltage signal, and a cathode connected to the voltage dividing branch circuit, and is configured to rectify the first voltage signal. The first resistor R1 has one terminal connected to the voltage dividing branch circuit, and another terminal connected to the first terminal of the first controllable switch Q1, and is configured to perform current limiting on the first voltage signal. The voltage dividing branch circuit includes a second resistor R2 and a third resistor R3, where the second resistor R2 is connected in series between the first diode D1 and the first resistor R1 (i.e., one terminal connected to the cathode of the first diode D1, and another terminal connected to the first resistor R1), and the third resistor R3 has one terminal connected between the first resistor R1 and the second resistor, and another terminal grounded.

Still further, as shown in FIG. 2, the preprocessing circuit further includes a second diode D2 and a first capacitor C1. The second diode D2 and the first capacitor C1 are connected in parallel to the third resistor R3, respectively. Moreover, the second diode D2 and the first capacitor C1 are connected between the first resistor R1 and the second resistor R2. The second diode D2 is configured to perform voltage regulation of the first voltage signal, and the first capacitor C1 is configured to filter out small clutter signals in the first voltage signal.

In addition, the second terminal of the first controllable switch Q1 is connected to a first direct current power source DC1 through a pull-up resistor R5, and the third terminal of the first controllable switch Q1 is grounded, i.e., the second voltage signal connected with the third terminal is zero. The first controllable switch Q1 is a first triode. The first terminal of the first controllable switch Q1 is a base electrode of the first triode, the second terminal of the first controllable switch Q1 is a collecting electrode of the first triode, and the third terminal of the first controllable switch Q1 is an emitting electrode of the first triode. Then, the base electrode of the first triode is connected to the first voltage signal processed by the preprocessing circuit, the collecting electrode outputs the third voltage signal, and the emitting electrode is grounded.

When the signal processing unit is working, the first voltage input signal MltCon connected with the input terminal is processed by the preprocessing circuit, and then connected with the base electrode of the first triode. When the voltage of the first voltage signal is greater than the voltage of the emitting electrode of the first triode (i.e., when the voltage of the first voltage signal is greater than zero), the first triode is turned on, and the second voltage signal outputted from its emitting electrode is a low level. When the voltage of the first voltage signal is less than or equal to the voltage of the emitting electrode of the first triode (i.e., when the voltage of the first voltage signal is less than or equal to zero), the first triode is turned off, and the second voltage signal outputted from its emitting electrode is a high level. Therefore, the turning-on or turning-off of the first triode will cause the collecting electrode to output a different third voltage signal, and then the controller can determine whether the first voltage signal inputted into the signal converting unit is changed based on the different third voltage signal, so that when the first voltage signal is a switching signal of the to-be-controlled terminal, the controller can implement multiplex switch control on the to-be-controlled terminal by sending a different switch control signal to the to-be-controlled terminal.

As a specific implementation of the present embodiment, an MltCon terminal may be connected to 3 different signals (a hot line L, a neutral line N, and a load line LOUT1). A signal inputted from the MltCon terminal is rectified by the first diode D1; and then subject to voltage dividing by the voltage dividing branch circuit. The second diode D2 plays a role in voltage regulation and protection, so that the output voltage is within a permissible range. The first capacitor C1 plays a role in filtering to a certain extent to filter out small clutter signals. The first resistor R1 plays a role in current limiting, and the resistor R5 pulls up an MltConIn signal to a first direct current power supply voltage (e.g., +3.3V). When the first triode is turned on, the MltConIn is pulled down to output a low level; and when the first triode is turned off, the MltConIn is pulled up to output a high level. The MltConIn signal is finally outputted to the first port of the controller for processing. The MltConIn signal processed by the signal converting unit is inputted into the first port of the controller. The controller will use determination mechanisms of different functions based on different types of the first voltage signal.

For example: (1) When the first voltage signal is connected with the hot line L: when the first voltage signal is connected with the hot line, the MltConIn outputs a low level; and when the first voltage signal is disconnected from the hot line, the MltConIn outputs a high level. Then, the controller can use filtering on changes of the high level and the low level as the basis for determining the multiplex switch control function.

(2) When the first voltage signal is connected with the neutral line N: when the first voltage signal is connected with the neutral line, the MltConIn outputs a pulse level with a certain duty ratio; and when the first voltage signal is disconnected from the neutral line, the MltConIn outputs a high level. Then, the controller can use filtering on changes of the pulse level and the high level as the basis for determining the multiplex switch control function.

Figure 6:
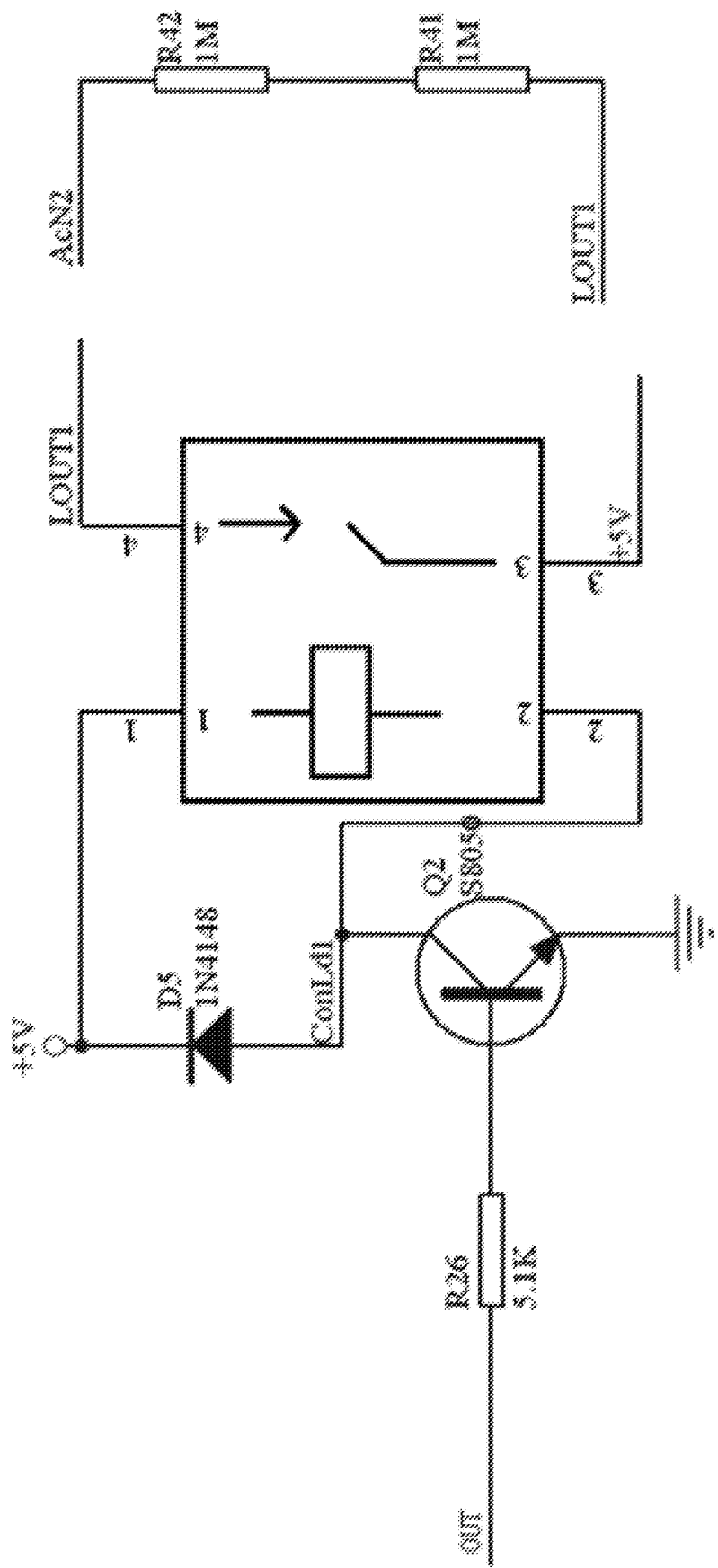
FIG. 6 is a structural schematic diagram of a relay load circuit according to an embodiment of the present disclosure.

(3) When the first voltage signal is connected with the load line LOUT1: as can be seen from the schematic diagram of the relay load circuit shown in FIG. 6, when the relay is in an off-state, and the first voltage signal is connected with the load line LOUT1, the MltConIn outputs a pulse level with a certain duty ratio; and when the first voltage signal is disconnected from the load line LOUT1, the MltConIn outputs a high level. When the relay is in an on-state, and the first voltage signal is connected with the load line LOUT1, the MltConIn outputs a low level; and when the first voltage signal is disconnected from the load line LOUT1, the MltConIn outputs a high level. Then, the controller can use filtering on changes of the pulse level, the low level, and the high level as the basis for determining the multiplex switch control function.

Figure 3:
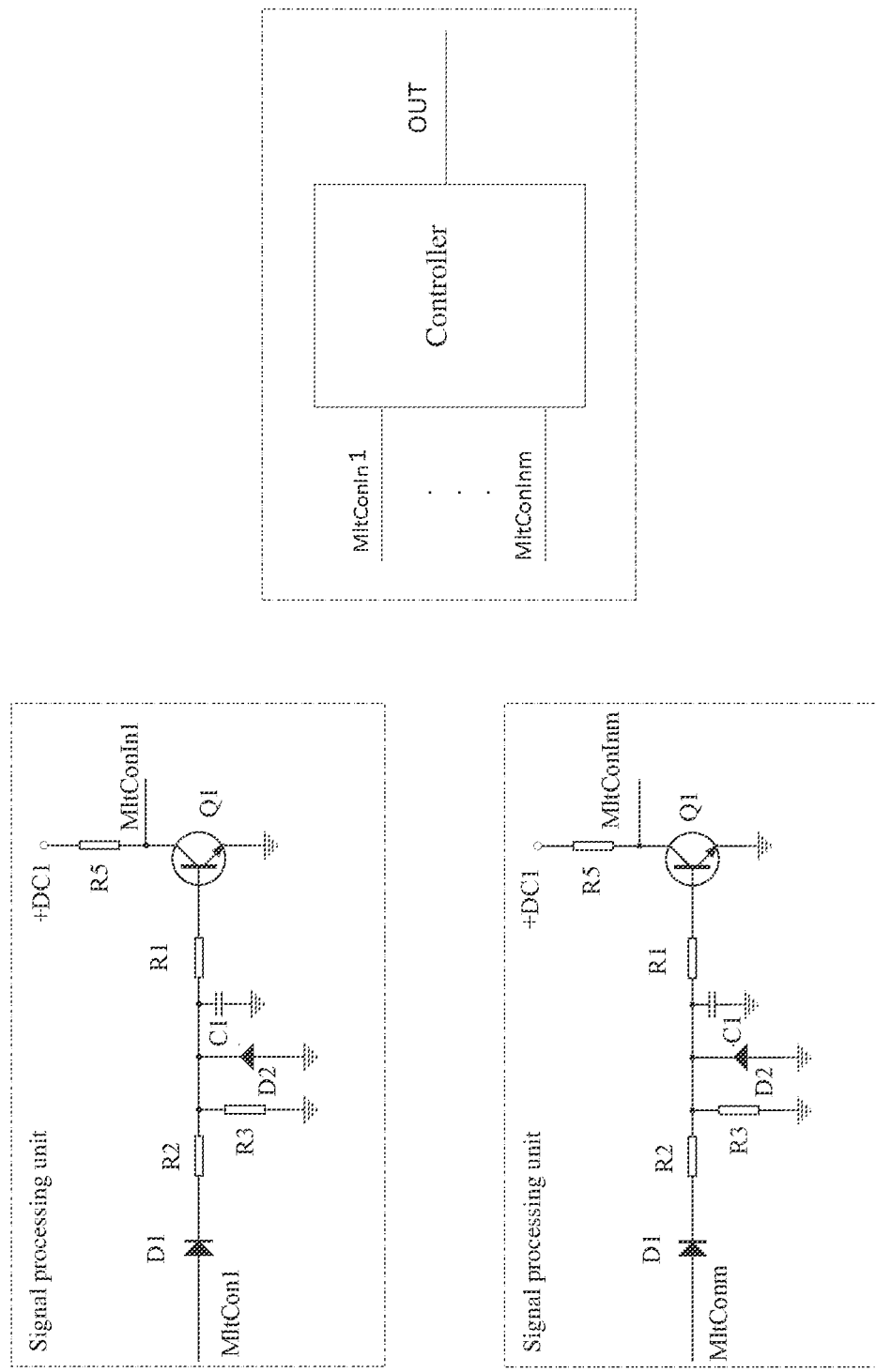
FIG. 3 is a structural schematic diagram of a switch control circuit according to an embodiment of the present disclosure.

An embodiment of the present disclosure further provides a switch control system. The system includes the switch control circuit as shown in FIG. 3, and a load. Please refer to the description of the embodiments shown in FIG. 1 and FIG. 2 for specific structural details of the switch control circuit. The description will not be repeated here.

In addition, the load is connected to an output terminal of a controller, and the switch control circuit is configured to implement multiplex switch control of the load.

The switch control system provided in the present embodiment converts the first voltage signal with the signal processing unit into the third voltage signal suitable for the controller to work, and then implements multiplex switch control on the to-be-controlled terminal with the controller. That is, the circuit converts a electrical signal of a high voltage in strong electricity into a stable electrical signal of a low voltage in weak electricity, implements multiplex switch control in conjunction with the controller, and only processes voltage signals in the whole circuit, thereby avoiding processing signals of a plurality of types, and guaranteeing the reliability of the multiplex switch control.

As a concrete application example of the present embodiment, when the switch control system is in practical work, the first voltage signal connected with the input terminal of the signal processing unit is a power source of the load, i.e., the power source (e.g., hot line) of the load is connected to the signal processing unit through a switch, and the number of the signal processing units corresponds to the number of load control branch circuits. For example, when it is necessary to implement 4-way control of the load, then power sources in 4 different places are connected to corresponding signal processing units respectively through their own switches, and the output terminals of the signal processing units are connected to the pins of the controller, respectively. The controller determines whether it is necessary to send a switch control instruction to the load based on change of the third voltage signal connected with each pin. Specifically, for example, when the load is connected to the power source, the 4-way control corresponds the same on/off state, the hot line is connected to the input terminal of the signal converting unit, and each pin of the controller is a low level. If a pin of the controller is a high level at a moment, the controller sends a switch control instruction to the load, so that the load is disconnected from the power source. If a level change at a pin of the controller occurs again at a next moment, then a switch control instruction is sent to the load, so that the load is connected to the power source, etc.

Figure 4:
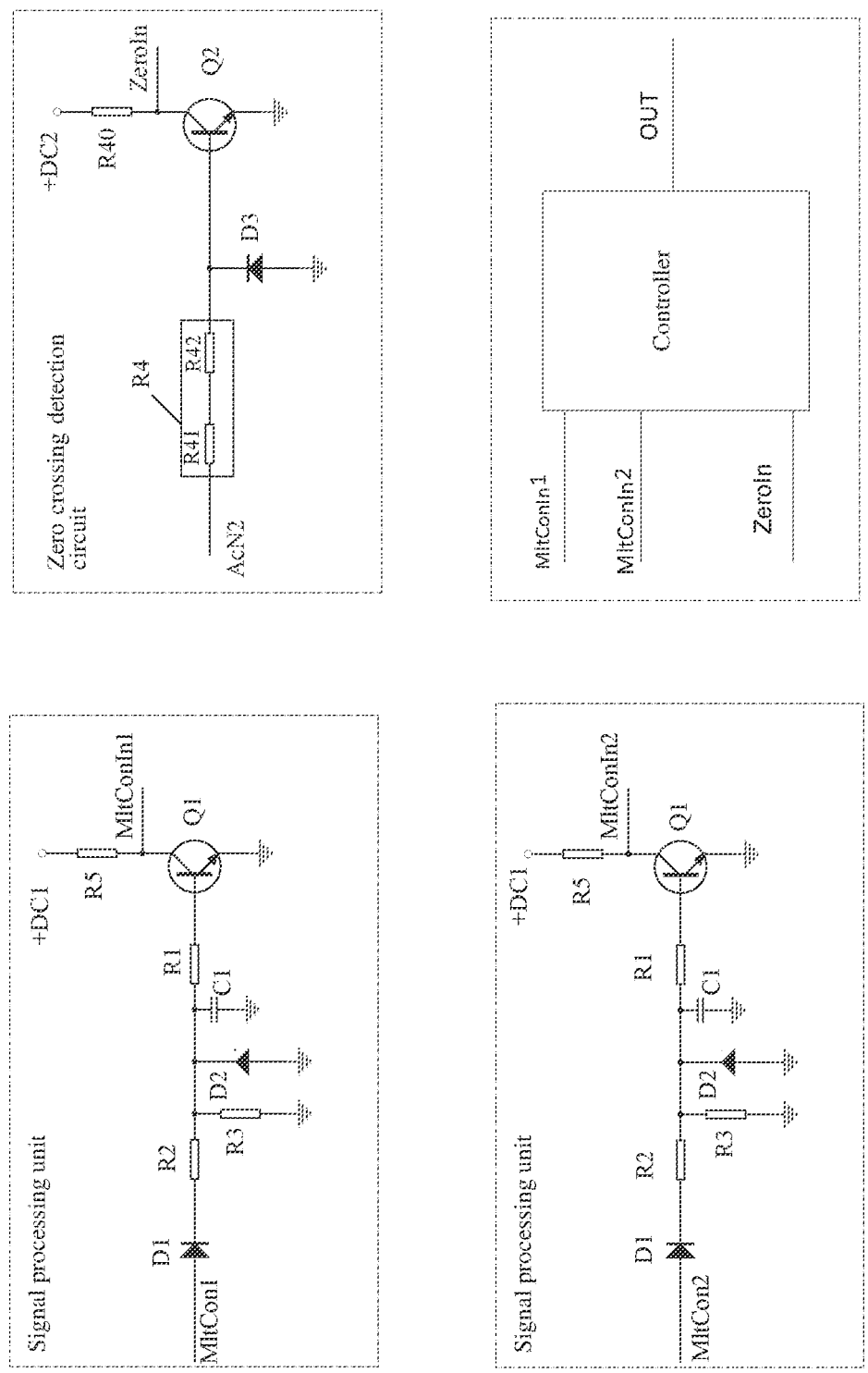
FIG. 4 is a structural schematic diagram of a switch control system according to an embodiment of the present disclosure.

As an alternative implementation of the present embodiment, the switch control system is configured to implement two-way switch control of the load. The load is a relay load circuit. As shown in FIG. 4, the switch control system includes two parallel-connected signal processing units and a zero crossing sampling circuit. An input terminal of each of the signal processing units is connected to a corresponding switch, respectively.

Specifically, the zero crossing sampling circuit has a second controllable switch. The zero crossing sampling circuit has an input terminal connected to a power source of the load, and an output terminal connected to a second port of the controller; and converts the power source of the load into a direct current signal through turning-on and turning-off of the second controllable switch. The controller extracts a zero voltage point of the power source of the load with the direct current signal, and sends a switch control instruction to the relay load circuit. Alternatively, the second controllable switch may be a triode, or a transistor of other voltage control type, as long as the second controllable switch is capable of converting an alternating current power source of the load into a direct voltage signal suitable for the controller to work.

As shown in FIG. 4, the switch control system includes two signal processing units. The input terminals of the signal processing units are respectively connected to power source control signals of the load, i.e., MltCon1 and MltCon2. After the above two control signals are processed by the signal processing units, MltConIn1 and MltConIn2 are outputted respectively. The output terminals of the signal processing units are connected with the first port of the controller. In addition, the input terminal of the zero crossing sampling circuit is connected to a power source AcN2 of the load, an output signal ZeroIn of the output terminal is connected with the second port of the controller. The controller sends a control signal OUT to the relay load based on the signals of the first port and the signal of the second port.

Figure 5:
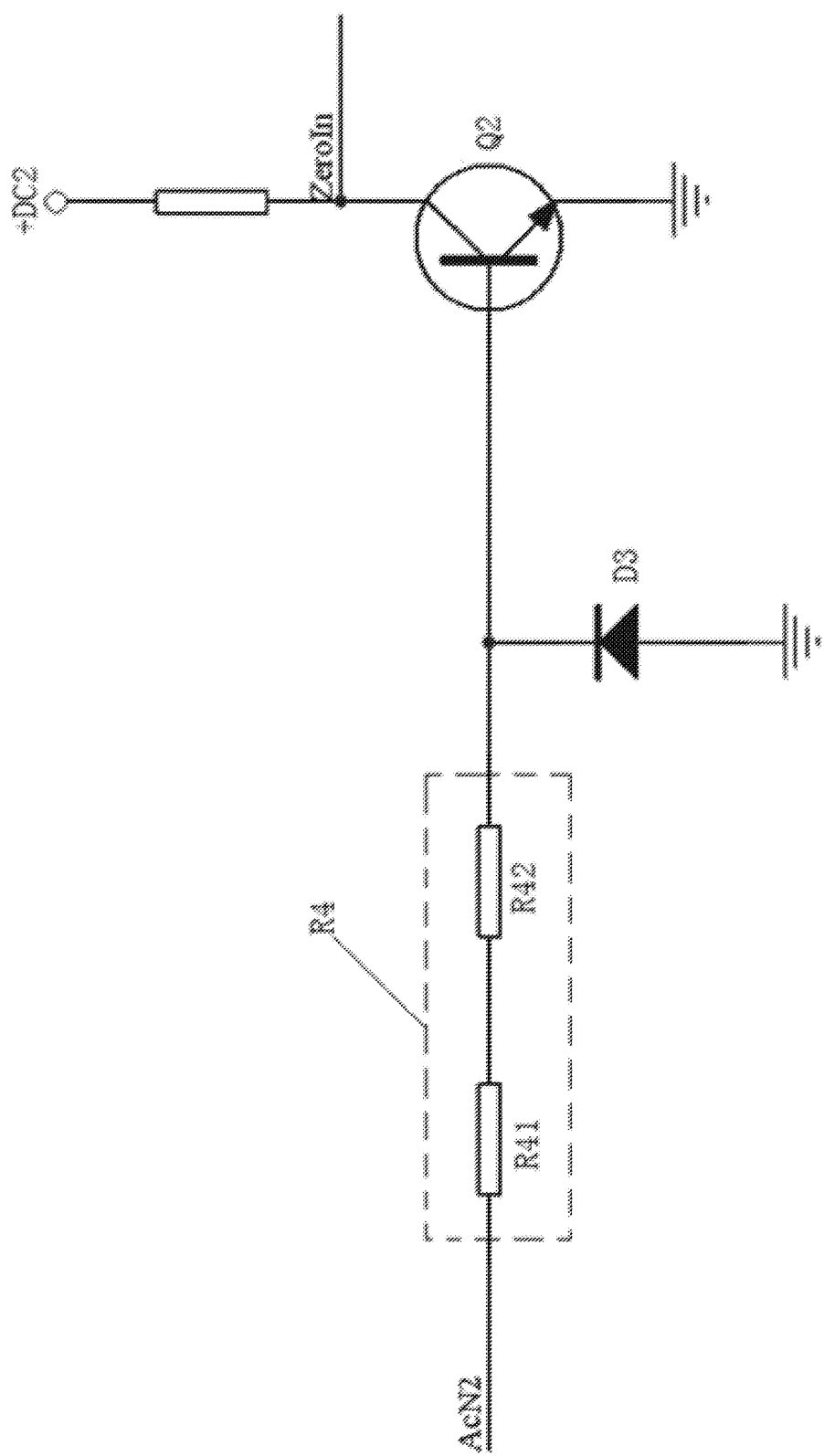
FIG. 5 is a structural schematic diagram of a zero crossing point detecting circuit according to an embodiment of the present disclosure.

As an alternative implementation of the present embodiment, the zero crossing sampling circuit, as shown in FIG. 5, includes a fourth resistor R4 and a second controllable switch Q2. The second controllable switch Q2 has a fourth terminal, a fifth terminal, and a sixth terminal. One terminal of the fourth resistor R4 is connected to the power source AcN2 of the load, and another terminal of the fourth resistor R4 is connected to the fourth terminal of the second controllable switch Q2. The fourth resistor R4 is configured to perform current limiting on the power source AcN2 of the load.

Alternatively, the fourth resistor R4 may be a resistor, or series connection and parallel connection of a plurality of resistors, for example, series connection of two resistors R41 and R42 as shown in FIG. 5.

Further alternatively, the zero crossing sampling circuit may further include other functional circuits, such as filtering, current limiting, and voltage dividing. Specifically, other functional circuits of the zero crossing sampling circuit may be specifically set according to the actual situation, and are not defined here.

The second controllable switch Q2 is a second triode. The fourth terminal of the second controllable switch Q2 is a base electrode of the second triode, the fifth terminal of the second controllable switch Q2 is a collecting electrode of the second triode, and the sixth terminal of the second controllable switch Q2 is an emitting electrode of the second triode. The base electrode of the second triode is connected to the power source of the load, the collecting electrode of the second triode is connected to a direct current power source DC2 using a pull-up resistor, and the emitting electrode of the second triode is grounded. Further alternatively, a third diode D3 is also connected between the fourth resistor R4 and the base electrode of the second triode, and is configured to perform filtering on the power source of the load.

When the zero crossing sampling circuit is working, the ACN2 is connected to an inputted voltage AC 120V, and drives a second triode Q2 after current limiting by the fourth resistor R4, wherein the third diode D3 plays a role in reverse protection, and the second direct current power source is +3.3V. When a terminal voltage of the AcN2 is higher than GND, the second triode Q2 is turned on, the ZeroIn is pulled down to the GND (i.e., the ZeroIn outputs a low level); and when the terminal voltage of the AcN2 is lower than the GND, the second triode Q2 is turned off, and the ZeroIn is pulled up to +3.3V (i.e., the ZeroIn outputs a high level). The zero crossing sampling circuit converts the alternating current power source of the load into a high-level or low-level signal. Then, the controller can extract the zero voltage point of the power source of the load using the ZeroIn. For example, the controller can determine whether voltage jump of the ZeroIn occurs in real time, and when the voltage jump of the ZeroIn occurs, records the moment at this time point, wherein the moment is the zero voltage point of the power source of the load.

Figure 7:
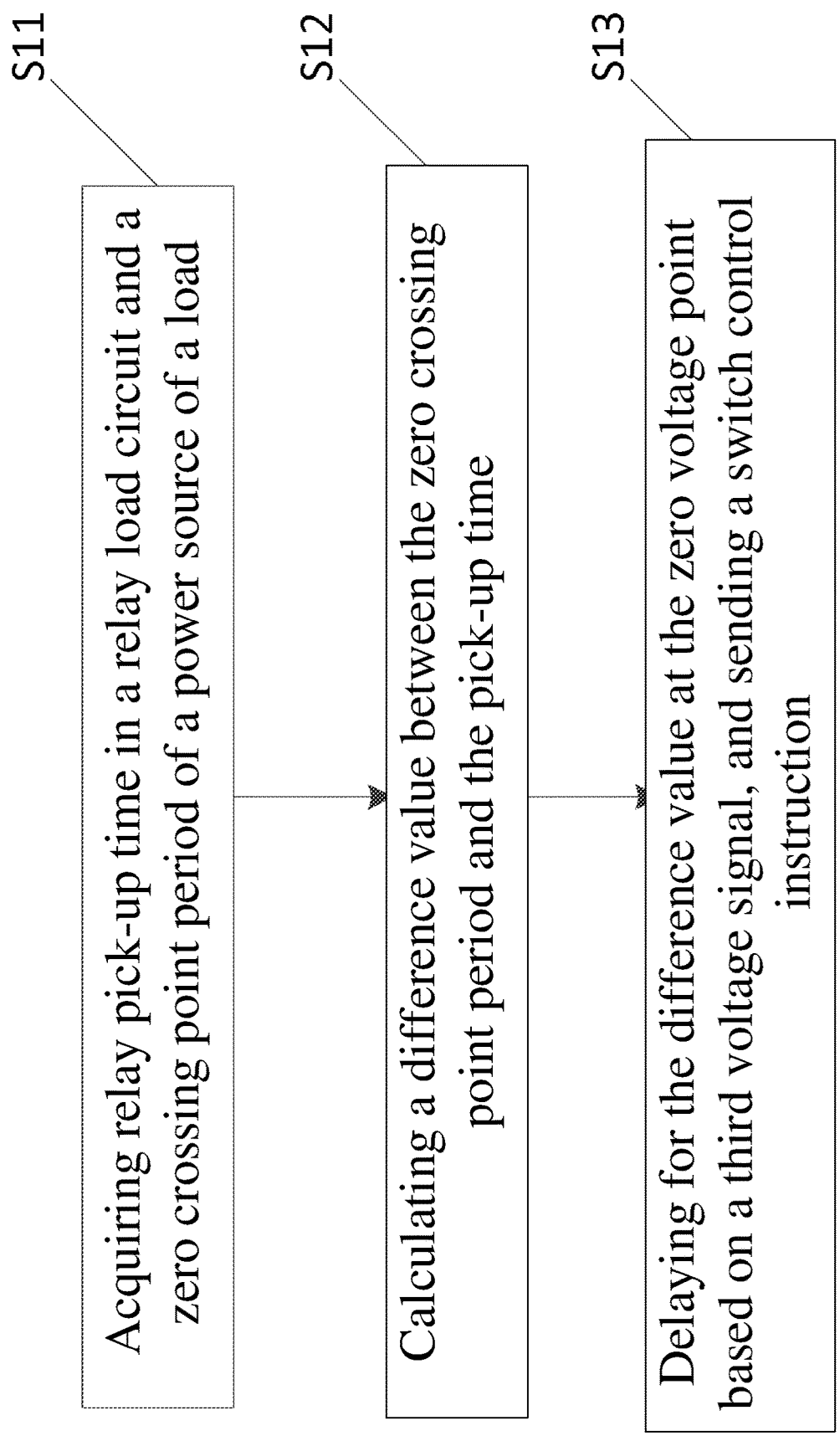
FIG. 7 is a flowchart of signal processing of a controller according to an embodiment of the present disclosure.

As an alternative implementation of the present embodiment, as shown in FIG. 7, the controller sends a switch control instruction to a relay load circuit based on a third voltage signal and a zero voltage point, which can be implemented through the following steps:

S11: Acquiring relay pick-up time in a relay load circuit and a zero crossing point period of a power source of a load.

The structural diagram shown in FIG. 6 may be used to show configuration of the relay load circuit, wherein the OUT is connected to the output terminal of the controller, the LOUT1 is an input terminal of the signal converting unit connected to the load line, and the AcN2 is a power source of the load.

The relay pick-up time in the relay load circuit may be acquired by an oscilloscope. For example, a time interval from a relay action to contact closure acquired by the oscilloscope is 6 ms. The zero crossing point period of the power source of the load can be calculated based on the frequency of the power source of the load. When the frequency of the power source is 60 Hz, the zero crossing point period of the power source is 8.33 ms.

S12: Calculating a difference value between the zero crossing point period and the pick-up time.

The controller calculates a delay time in relay closure at a zero crossing point of the power source using the acquired relay pick-up time data, e.g., 8.33–6=2.33 ms.

S13: Delaying for the difference value at the zero voltage point based on a third voltage signal, and sending a switch control instruction.

After detecting the zero crossing point of the power source, the controller delays for 2.33 ms in sending the control instruction to a relay, then the relay contact is closed after an interval of 6 ms, the time point of the contact closure is exactly a next zero crossing point of the power source, and finally the relay is caused to be closed accurately at the zero crossing point, thereby effectively protecting the relay contact.

Specifically, after determining that the third voltage signal is changed, the controller causes the relay to be closed accurately at the zero crossing point of the power source based on the zero crossing voltage while implementing double control of the relay load.

As an alternative implementation of the present disclosure, the controller may be a single chip, or a controller of other type, such as a WIFI processing module, as long as the controller is capable of implementing the functions described in the embodiments of the present disclosure.

While the embodiments of the present disclosure are described in conjunction with the accompanying drawings, those skilled in the art can make various modifications and variations without departing from the spirit and scope of the present disclosure. Such modifications and variations all fall within the scope as defined in the appended claims.

The invention claimed is:

1. A switch control circuit, comprising:
a plurality of parallel-connected signal processing units, wherein a signal processing unit of the plurality of parallel-connected signal processing units ha a first controllable switch; the first controllable switch having a first terminal connected to a first voltage signal, a second terminal connected to a first port of a controller, and a third terminal connected to a second voltage signal; the first voltage signal and the second voltage signal controlling turning-on and turning-off of the first controllable switch, and converting the first voltage signal into a third voltage signal; and the third voltage signal being connected with the first port of the controller; and
the controller, configured to send a switch control instruction to a to-be-controlled terminal based on the third voltage signal;
wherein the signal processing unit further comprises:
a preprocessing circuit comprising:
  a first diode configured to rectify the first voltage signal;
  a first resistor connected to the first diode in series and configured to perform current limiting on the first voltage signal; and
  a voltage dividing branch circuit having a second resistor and a third resistor, wherein the second resistor is connected in series between the first diode and the first resistor, and one terminal of the third resistor is connected between the first resistor and the second resistor; and
  the preprocessing circuit is connected to the first terminal of the first controllable switch; wherein an input terminal of the preprocessing circuit is connected to the first voltage signal and is configured to perform at least one of rectifying, voltage dividing, or current limiting on the first voltage signal; and wherein the second terminal of the first controllable switch is connected to a first direct current power source and the second voltage signal is zero.

2. The circuit according to claim 1, wherein the preprocessing circuit further comprises:
a second diode, connected in parallel to the third resistor, and configured to perform voltage regulation on the first voltage signal; and
a first capacitor, connected in parallel to the third resistor, and configured to perform filtering on the first voltage signal.

3. The circuit according to claim 1, wherein the first controllable switch is a first bipolar junction transistor, the first terminal is a base electrode of the first bipolar unction transistor, the second terminal is a collecting electrode of the first bipolar junction transistor, and the third terminal is an emitting electrode of the first bipolar junction transistor.

4. A switch control system, comprising:
a switch control circuit comprising a plurality of parallel-connected signal processing units, a signal processing unit of the plurality of parallel-connected signal processing units having a first controllable switch; the first controllable switch having a first terminal connected to a first voltage signal, a second terminal connected to a first port of a controller, and a third terminal connected to a second voltage signal; the first voltage signal and the second voltage signal controlling turning-on and turning-off of the first controllable switch, and converting the first voltage signal into a third voltage signal; and the third voltage signal being connected with the first port of the controller, the controller configured to send a switch control instruction to a to-be-controlled terminal based on the third voltage signal; and
a load, connected to an output terminal of the controller; the switch control circuit being configured for multiplex switch control of the load, wherein the load is a relay load circuit; and wherein the switch control system comprises:
  two parallel-connected signal processing units, wherein an input terminal of each of the two parallel connected signal processing units is connected to a corresponding switch, respectively;
  a zero crossing sampling circuit, having a second controllable switch; the zero crossing sampling circuit having an input terminal connected to a power source of the load, and an output terminal connected to a second port of the controller; wherein the zero crossing sampling circuit converts the power source of the load into a direct current signal through turning-on and turning-off of the second controllable switch; and
  a controller extracting a zero voltage point of the power source of the load through the direct current signal, and sending a switch control instruction to the relay load circuit based on the third voltage signal and the zero voltage point.

5. The system according to claim 4, wherein the zero crossing sampling circuit comprises:
the second controllable switch, having a fourth terminal, a fifth terminal, and a sixth terminal; wherein the fourth terminal is connected to the power source of the load; the fifth terminal is connected to a second direct current power source, and is connected to the second port of the controller; and the sixth terminal is grounded; and
a fourth resistor, the power source of the load being connected to the fourth terminal through the fourth resistor; wherein the fourth resistor is configured to perform current limiting on the power source of the load.

6. The system according to claim 5, wherein the second controllable switch is a second bipolar junction transistor, the fourth terminal is a base electrode of the second bipolar junction transistor, the fifth terminal is a collecting electrode of the second bipolar junction transistor, and the sixth terminal is an emitting electrode of the second bipolar junction transistor.

7. The system according to claim 4, wherein sending a switch control instruction to the relay load circuit based on the third voltage signal and the zero voltage point comprises:
acquiring relay pick-up time in the relay load circuit and a zero crossing point period of the power source of the load;
calculating a difference value between the zero crossing point period and the pick-up time; and
delaying for the difference value at the zero voltage point based on the third voltage signal, and sending the switch control instruction.

* * * * *